US007111213B1

(12) United States Patent
Dastidar et al.

(10) Patent No.: US 7,111,213 B1
(45) Date of Patent: Sep. 19, 2006

(54) FAILURE ISOLATION AND REPAIR TECHNIQUES FOR INTEGRATED CIRCUITS

(75) Inventors: Jayabrata Ghosh Dastidar, Santa Clara, CA (US); Michael Harms, Pleasanton, CA (US)

(73) Assignee: Altera Corporation, San Jose, CA (US)

( * ) Notice: Subject to any disclaimer, the term of this patent is extended or adjusted under 35 U.S.C. 154(b) by 375 days.

(21) Appl. No.: 10/316,607

(22) Filed: Dec. 10, 2002

(51) Int. Cl.
*G01R 31/28* (2006.01)
*G06F 11/00* (2006.01)

(52) U.S. Cl. .......................... 714/724; 714/5; 714/10; 714/711

(58) Field of Classification Search ................ 714/724, 714/725, 726, 729, 734, 742, 746, 759, 767, 714/772, 781, 761, 710, 5, 10, 44, 25; 326/38–39
See application file for complete search history.

(56) References Cited

U.S. PATENT DOCUMENTS

| 3,702,011 | A | * | 10/1972 | Armstrong .................. 714/33 |
| 4,809,276 | A | * | 2/1989 | Lemay et al. ................ 714/704 |
| 4,899,067 | A | | 2/1990 | So et al. |
| 5,369,314 | A | | 11/1994 | Patel et al. |
| 5,434,514 | A | | 7/1995 | Cliff et al. |
| 5,485,102 | A | | 1/1996 | Cliff et al. |
| 5,504,440 | A | | 4/1996 | Sasaki |
| 5,592,102 | A | | 1/1997 | Lane et al. |
| 5,627,480 | A | | 5/1997 | Young et al. |
| 5,790,479 | A | | 8/1998 | Conn |
| 5,942,913 | A | | 8/1999 | Young et al. |
| 5,991,898 | A | | 11/1999 | Rajski et al. |
| 6,034,536 | A | | 3/2000 | McClintock et al. |
| 6,107,820 | A | | 8/2000 | Jefferson et al. |
| 6,117,180 | A | * | 9/2000 | Dave et al. ................... 703/20 |
| 6,154,851 | A | * | 11/2000 | Sher et al. .................... 714/5 |
| 6,201,404 | B1 | | 3/2001 | Reddy et al. |
| 6,233,205 | B1 | | 5/2001 | Wells et al. |
| 6,388,929 | B1 | * | 5/2002 | Shimano et al. ............. 365/201 |
| 6,395,566 | B1 | * | 5/2002 | Farnworth .................... 438/15 |
| 6,529,041 | B1 | | 3/2003 | Ng et al. |
| 6,671,834 | B1 | * | 12/2003 | Zhu et al. ................... 714/711 |

(Continued)

FOREIGN PATENT DOCUMENTS

GB     2 283 602     5/1995

(Continued)

OTHER PUBLICATIONS

Xilinx "Virtex-II Platform FPGAs: Detailed Description, Advance Product Specification," DS031-2 (v2.1.1) Dec. 6, 2002.

(Continued)

*Primary Examiner*—Guy Lamarre
*Assistant Examiner*—Fritz Alphonse
(74) *Attorney, Agent, or Firm*—Townsend and Townsend and Crew, LLP

(57) ABSTRACT

Techniques for isolating and repairing failures on a programmable circuit are provided. An error on programmable circuit may be caused by a defect on the chip. The error is located, and the circuit elements effected by the defect are isolated. By identifying operable circuit elements near the defect, the number of circuit elements that are adversely effected by the defected can be narrowed down. The failed circuit elements adversely effected by the defect are then shut down and cut off from the rest of the programmable circuit. The functionality performed by the failed circuit elements is transferred to an unused portion of the programmable circuit. The se techniques reduce the amount of circuit elements that need to be shut down as a result of a defect on a programmable circuit.

26 Claims, 3 Drawing Sheets

U.S. PATENT DOCUMENTS

| | | | |
|---|---|---|---|
| 6,675,325 B1 * | 1/2004 | Garney et al. | 714/43 |
| 6,691,247 B1 * | 2/2004 | Shore | 714/8 |
| 6,754,117 B1 * | 6/2004 | Jeddeloh | 365/201 |
| 6,795,951 B1 * | 9/2004 | Hathaway et al. | 716/5 |
| 2002/0003742 A1 | 1/2002 | Nguyen et al. | |
| 2003/0072185 A1 | 4/2003 | Lane et al. | |

FOREIGN PATENT DOCUMENTS

| | | |
|---|---|---|
| GB | 2 321 989 | 8/1998 |
| WO | WO 98/53401 | 11/1998 |

OTHER PUBLICATIONS

Xilinx "Virtex-II Platform FPGAs: Introduction and Overview, Advance Product Specification," DS031-1 (v1.9) Sep. 26, 2002; Xilinx "Virtex-II EasyPath FAQs" 4 pages total.

Chin-Long Wey, "On Yield Consideration for the Design of Redundant Programmable Logic Arrays", 24th ACM/IEEE Design Automation Conference, 1987.

Demjaneko et al., "Yield Enhancement of Field Programmable Logic Arrays by Inherent Component Redundancy", IEEE Transactions on Computer-Aided Design, vol. 9, No. 8, Aug. 1990.

IBM Corporation, "Implementation of Diagnostics and Redundancy on a programmable Logic Array", IBM Technical Disclosure Bulletin, vol. 28 No. 6 Nov. 1983.

Xilinx "Virtex-II Platform FPGAs: Detailed Description, Advance Product Specification," DS031-2 (v2.1.1) Dec. 6, 2002.

Xilinx "Virtex-II Platform FPGAs: Introduction and Overview, Advance Product Specification," DS031-1 (v1.9) Sep. 26, 2002; Xilinx "Virtex-II EasyPath FAQs" 4 pages total.

* cited by examiner

FAILURE ISOLATION AND REPAIR TECHNIQUES FOR INTEGRATED CIRCUITS

BACKGROUND OF THE INVENTION

The present invention relates to techniques for repairing failures on a programmable circuit, and more particularly, to techniques for isolating failures on a programmable circuit and repairing the failures by transferring the functionality associated with a failed circuit block to another part of the circuit.

Integrated circuits sometimes fail to operate properly as a result of defects. For example, the die of an integrated circuit may become scratched. The integrated circuit may fail to operate properly as a result of the scratch. As another example, circuit failures may be caused by a short that develops in the integrated circuit.

A programmable circuit such as a programmable logic device may develop a defect before the circuit has been configured or programmed according to a particular user design. When a defect occurs in a programmable circuit before the circuit has been configured, a failed row of programmable circuit elements that have not been configured or programmed can be replaced with an extra redundant row of programmable circuit elements.

A circuit failure can also occur in programmable circuits after the circuit has been configured according to a user design. For example, a circuit failure can occur on a programmable circuit, while the circuit is being used for a user application. Often circuit failures are caused by defects in small portions of the chip.

It would therefore be desirable to provide a mechanism for locating and isolating defects on a programmable circuit after the programmable circuit has been configured according to a user design. It would also be desirable to provide techniques for repairing a localized failure on a programmable circuit without having to reconfigure the entire circuit design.

BRIEF SUMMARY OF THE INVENTION

The present invention provides techniques for isolation and repairing failed regions of a programmable circuit that has been configured according to a user design. Programmable circuits include programmable logic devices (PLD), field programmable gate arrays (FPGA), and programmable logic arrays (PLA).

An error on a programmable circuit may be caused by a defect in a region of the chip. Techniques of the present invention locate the error on the programmable circuit. The present invention can identify an error in an entire row of circuit elements. Alternatively, the present invention can identify an error in a group of circuit elements that are coupled together according to the user design.

By identifying operable circuit elements near the defect, the number of circuit elements that are adversely effected by the defected can be narrowed down, according to one embodiment of the present invention.

The failed circuit elements associated with the defect are then shut down and cut off from the rest of the programmable circuit. The functionality performed by the failed circuit elements is transferred to an unused portion of the programmable circuit. For example, an unused redundant row of circuit elements in a programmable circuit can be swapped with a failed row. As another example, unused groups of programmable circuit elements can be reprogrammed to replace the failed circuit elements. The present invention reduces the amount of circuit elements that need to be shut down as a result of a defect or circuit failure on an programmable circuit.

DETAILED DESCRIPTION OF THE INVENTION

The present invention provides a system for rapidly isolating and repairing failures in a programmable circuit configured according to a user design. Programmable circuits include, for example, programmable logic devices (PLD), field programmable gate arrays (FPGA), or programmable logic arrays (PLA). A programmable circuit may be an integrated circuit.

A programmable circuits includes programmable circuit elements. A programmable circuit is configured according to a user design by programming the programmable circuit elements. Logic elements are examples of programmable circuit elements. A logic element may include a look-up table and a register.

According to the present invention, a defect on a programmable circuit is identified and isolated. The programmable circuit is then reprogrammed to avoid the faulty logic, thereby increasing the useable life of the programmable circuit. The present invention can detect, isolate, and repair defects on programmable circuits that have been configured according to a user design.

Figure 1:
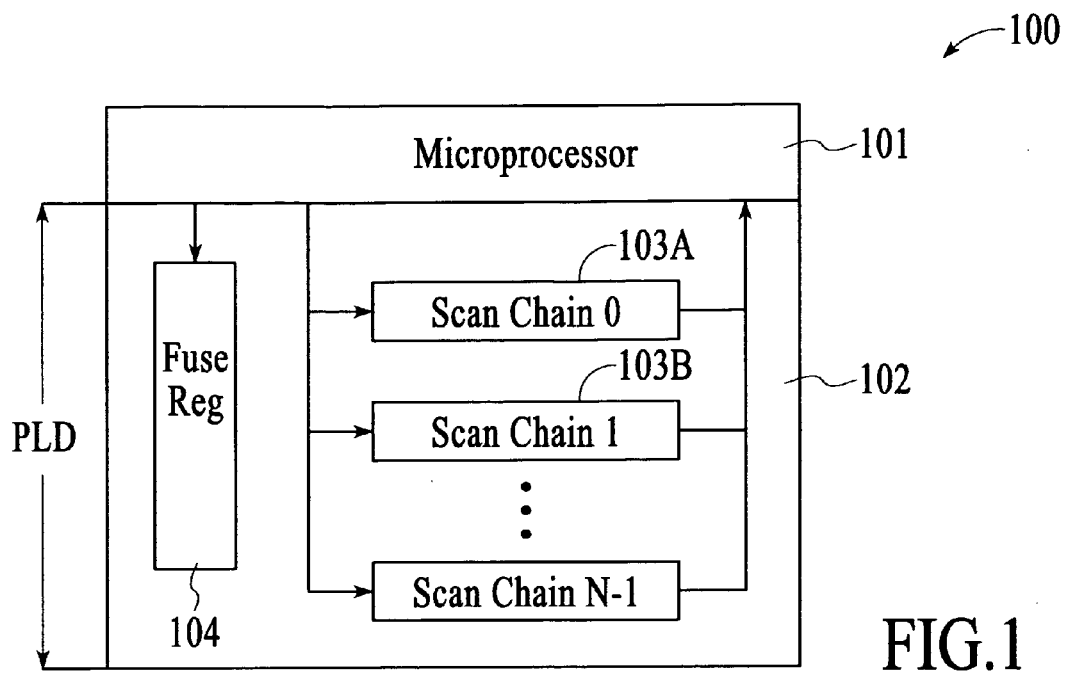
FIG. 1 illustrates an integrated circuit with a microprocessor and a programmable logic device that has a fuse register and a plurality of scan chains in accordance with the present invention.

FIG. 1 illustrates an integrated circuit 100 of the present invention. Integrated circuit 100 includes a microprocessor 101 and a programmable logic device (PLD) 102. PLD 102 has been configured according to a user design.

PLD 102 includes a fuse register 104 and a plurality of rows of logic elements (or other types of circuit elements) such as rows 103A–103B. Each logic element can include, for example, a look-up table that can be programmable to perform a variety of logic functions.

Each of the logic elements in PLD 102 can also include an output register that latches the output of the logic element. A particular user design may activate these output registers in some or all of the logic elements.

Microprocessor 101 can control the logic elements in PLD 102. For example, microprocessor 101 can enable an output register in each of the logic elements, regardless of whether all the output registers are enabled by a particular user design. By enabling the registers in each logic element, microprocessor 101 can configure the rows of logic elements as chains of registers.

Once they are configured as chains of registers, the rows of logic elements can be used as scan chains as shown in FIG. 1. Scan chains are used to test whether the logic elements are operating properly.

A programmable circuit such as PLD 102 can develop a defect after it has been configured according a user design. For example, a short or a scratch may develop on the programmable circuit, while the programmable circuit is in use for a user application. Therefore, it is desirable test a programmable circuit, after the programmable circuit has been configured, to ensure that the programmable circuit continues to operate properly.

Microprocessor 101 can test PLD 102, after PLD 102 is configured according to a user design. The test are designed to ensure the continued proper operation of PLD 102. PLD 102 can be tested in predefined or varying intervals of time. Microprocessor 101 tests the PLD by using the scan chains. Because microprocessor 101 and PLD 102 are on the same integrated circuit, the microprocessor performs "in-system" tests on PLD 102.

Microprocessor 101 can use one of two types of tests. The first type of test uses a deterministic set of test data generated for testing the current functionality of PLD 102. The test data is used to test whether logic elements and other circuit elements in PLD 102 are functional. The test data can be stored as compressed data in a memory location accessible by microprocessor 101.

Alternatively, a second type of test may be applied. According to this test scheme, microprocessor 101 operates like a built-in self-test (BIST) machine. Microprocessor 101 generates pseudo-random sequence of test data to test PLD 102.

To perform the first or second types of tests, microprocessor 101 accesses the test data and then scans in the test data in the scan chain registers shown in FIG. 1. Microprocessor 101 then applies a functional clock signal and captures the response of the PLD logic in the scan chain registers. Subsequently, the test data is read out of the scan chain registers and verified against a copy of the test data to verify its accuracy.

If PLD 102 fails a test, a defect exists somewhere in the PLD. The repair mechanism of the present invention makes an attempt to reprogram the programmable circuit in order to avoid faulty portions of the PLD. The present invention provides several techniques that can be used for repairing a faulty programmable circuit.

According to a first embodiment of the present invention, a trial and error technique is used to repair the faulty portion of an programmable circuit. This technique does not require any failure isolation capability. Microprocessor 101 can be used as the control to perform and/or aid test, failure isolation, and reprogramming of PLD 102.

A programmable circuit such as a PLD contains rows of programmable circuit elements. The rows may comprise, for example, logic elements, memory devices, and/or other circuit elements. Although techniques of the present invention can be used to repair defects in any type of circuit elements on a PLD, embodiments of the present invention are discussed below primarily in the context of rows of logic elements. Logic elements are used as an example and are not intended to limit the scope of the present invention.

A programmable circuit may be manufactured with redundant rows. Redundant rows are extra rows in the PLD. The redundant rows are used to replace rows that fail during diagnostic tests performed by the manufacturer of the PLD.

For example, after circuit 100 is manufactured, a diagnostic test is performed to check the operability of each row. If the diagnostic test reveals that one row of logic elements contains a defect, the failed row is replaced by a redundant row of logic elements.

Often some of the redundant rows in a PLD are not used during the manufacturer's test process. These extra redundant rows can be used to replace rows that fail at anytime during the life of the PLD. The extra redundant rows are invisible to a user when the user configures the programmable circuit according to a user design.

Figure 3A:
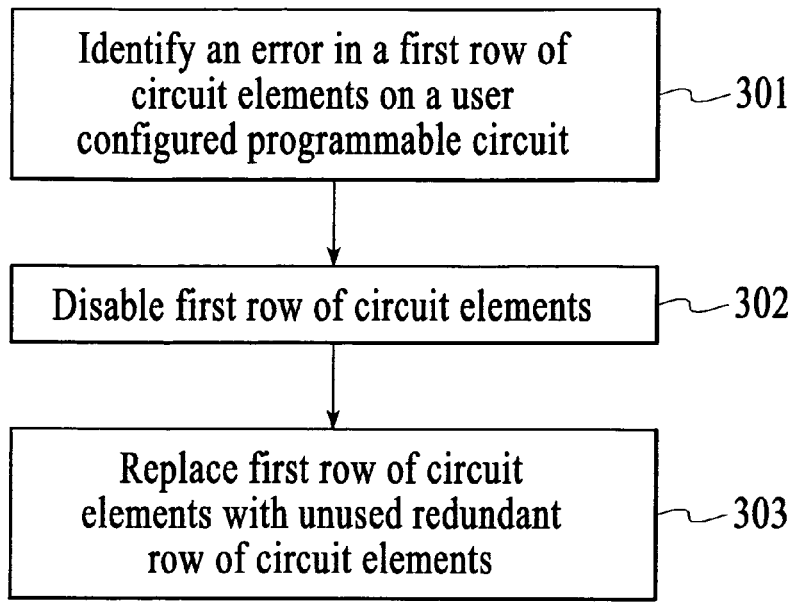
FIGS. 3A–3B are flow charts that illustrate steps performed according to embodiments of the present invention.

FIG. 3A illustrates process steps that can be followed according to an embodiment of the present invention. After a user has configured PLD 102 according to a user design, microprocessor 101 can perform periodic tests on PLD 102 to ensure that all of the rows of logic elements are operable. The tests can be performed during time periods when a user application is not actively using the PLD, so as not to interfere with the user application. In step 301, the microprocessor identifies an error in a row of logic elements (or other types of circuit elements) on PLD 102.

If microprocessor 101 determines at any time that a logic element in one of the rows has failed, microprocessor 101 disables the failed row at step 302. Microprocessor 101 then replaces the failed row with an unused redundant row using fuse register 104 at step 303. Fuse register 104 controls access to the rows. Microprocessor 101 can access fuse register 104 to replace the failed row with an unused redundant row.

Microprocessor 101 swaps the failed row that is currently used in PLD 102 with an unused redundant row. Microprocessor 101 then runs an initial set of test data through the redundant row to determine if the redundant row is operable. If the redundant row passes the test, the row swapping process is complete.

If the redundant row fails the test, microprocessor 101 swaps the redundant row with a second row using fuse register 104. The new swap row is then tested for operability. Microprocessor 101 continues to swap unused redundant rows with the rows currently used until a swap passes the operability test. After a redundant row passes the operability test, the redundant row is programmed with the same program sequence used to program the failed row in the user design.

After a failed row has been replaced with an operable redundant row, microprocessor 101 continues the diagnostic test to check the remaining rows in PLD 102. If there are other redundant rows in PLD 102 that have not been used, microprocessor 101 can replace any additional failed rows with these unused redundant rows using fuse register 104.

To speed up the repair process, microprocessor 101 begins by replacing the row in which a failure is observed. But the row in which a failure is observed is not always the row in which a defect actually exists. This is because logic elements in a row are coupled to logic elements in other rows through a global and local interconnect structure. For example, a defect that originates in a logic element in one row may cause errors in other rows. Therefore, replacing a row in which a failure is observed is not guaranteed to result in a successful repair.

Figure 2:
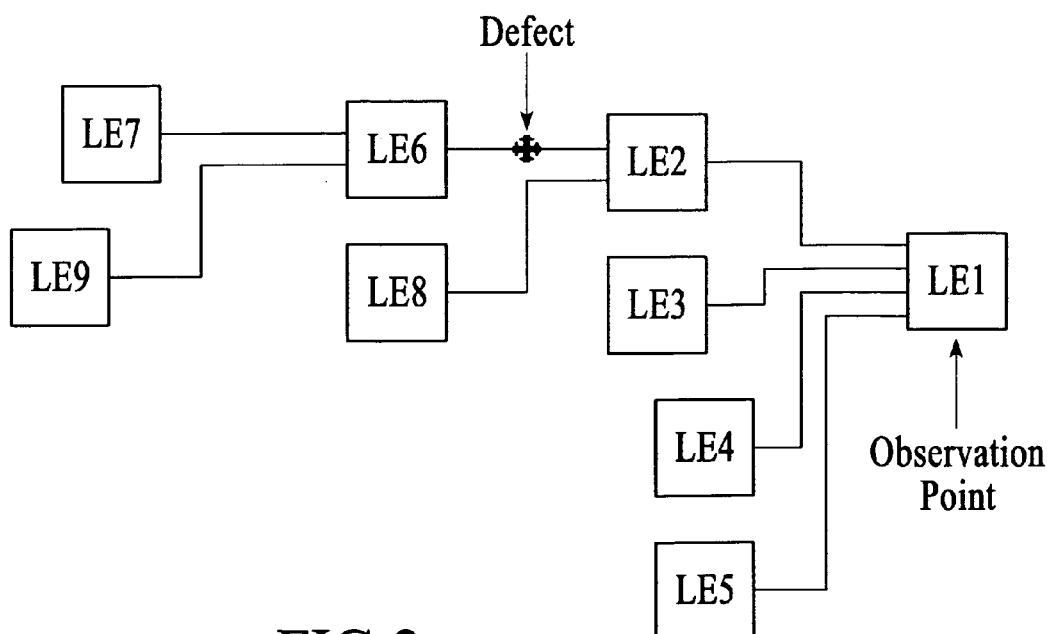
FIG. 2 illustrates an example of a fan-in cone associated with a defect in a programmable logic device in accordance with the present invention.

A fan-in cone is a subset of logic elements that are coupled together after the programmable circuit has been programmed according to a user design. FIG. 2 illustrates an example of a fan-in cone associated with logic element LE1. The fan-in cone includes logic elements LE1–LE9. Logic elements LE1–LE9 are coupled together in a programmable circuit as shown in FIG. 2 according to a particular user design.

Microprocessor 101 can monitor output signals of programmable circuit elements (e.g., logic elements) in a user configured programmable integrated circuit. When microprocessor 101 sees a failure at an observation point of a logic element, the defect in PLD 102 may lie anywhere in a fan-in cone associated with that logic element. For example, an observation point is marked in FIG. 2. An error is observed at the observation point of LE1 in FIG. 2. However, the defect is located between LE2 and LE6.

The fan-in cone associated with a logic element may include multiple rows. A defect that is observed at the output of a logic element may lie in a different row than the row where the error is observed. For example, an error is observed at LE1 in FIG. 2. LE2 and LE6 may lie in different row than LE1.

For this reason, multiple iterations of row swapping and test application may need to be performed to eliminate a defect. The process starts with the first row in which the error is captured. Microprocessor 101 swaps that first row with a first redundant row.

The process then progressively moves on to other rows. Microprocessor 101 can test rows adjacent to the first row to determine the presence of an error. If an error is detected in a second row, the first row is restored, and the second row is replaced with the first redundant row. This technique does not correct for the presence of defects that exist in the first row and in the second row.

Alternatively, if microprocessor 101 detects an error in a second row, microprocessor 101 swaps the second row with a second redundant row. If an error is detected in a third row, microprocessor 101 swaps the third row with a third redundant row. This technique requires more unused redundant rows.

The process continues until no errors are detected in any of the rows. If PLD 102 runs out of unused redundant rows, the process stops, and no additional defective rows can be replaced.

The above described techniques involve using trial and error to eliminate a defect. Each row in which an error is detected is replaced with a redundant row. These techniques are low cost, because pre-existing unused redundant rows are used to repair every defect in a row. However, if a fan-in cone associated with a failure is large, more rows than necessary may end up being replaced. Also, the programmable circuit may run out of unused redundant rows before all of the defects have been eliminated.

According to another embodiment of the present invention, techniques can be performed to identify and repair an error in a programmable circuit that has been configured according to a user design. According to this embodiment, only the programmable circuit elements effected by the error are replaced.

Figure 3B:
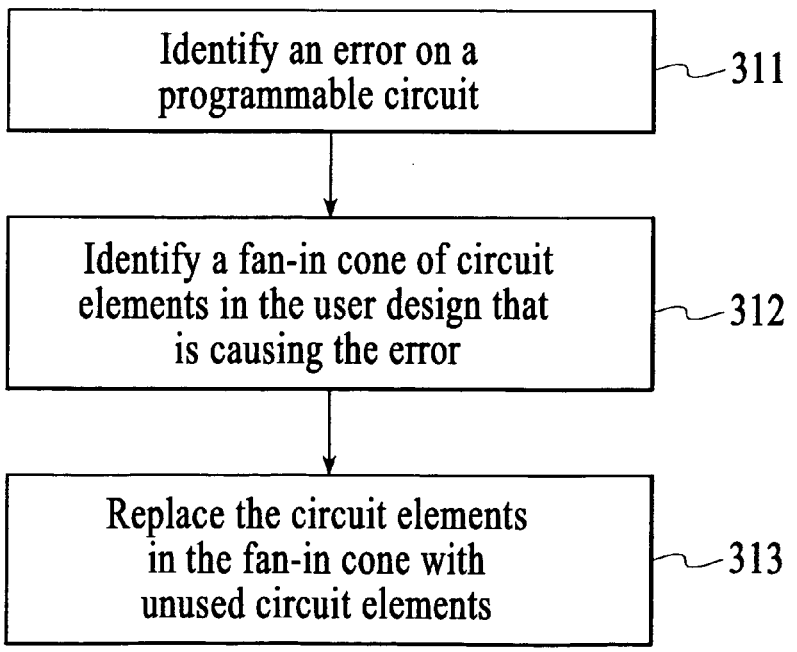

FIG. 3B illustrates steps that are associated with this embodiment. At step 311, the microprocessor identifies an error at an observation point on a programmable circuit. The error may be caused by a defect on the programmable integrated circuit.

At step 312, the microprocessor identifies a fan-in cone of circuit elements in the user design that is causing the error. To identify the fan-in cone, the microprocessor first records the scan position that has an error. This information is then sent to an analysis engine (AE). The analysis engine can reside in the same integrated circuit, or the AE can be an external processing unit.

The analysis engine has a representation of the user design that it can analyze. The analysis engine takes the failing scan position and traces the combinatorial fan-in cone feeding the failing scan position in the user design. The analysis engine marks all of the resources used in the fan-in cone. The fan-in cone may include logic elements located in multiple rows and columns of the programmable circuit as well as routing resources of interconnect conductors and programmable connections.

For example, an error may be detected at the observation point shown in FIG. 2. The analysis engine identifies the fan-in cone associated with logic element LE1. The fan-in cone includes logic elements LE1–LE9 that are connected together as shown in FIG. 2.

Once the fan-in cone associated with a defect has been isolated, the logic elements in the fan-in cone marked by the analysis engine are disabled and replaced with operable logic elements at step 313. The user design is reconfigured, leaving out the resources in the failed fan-in cone marked by the analysis engine.

Unused logic elements in the programmable circuit can replace the failed logic elements in the disabled fan-in cone. The unused logic elements are programmed according to the user design to perform the function of the disabled fan-in cone.

Typically, user designs do not use all of the resources (e.g., logic elements and interconnect conductors) in a programmable circuit. For example, a user design may use only 60% of the resources in a PLD with 40% of the resources unused. Typically, a programmable circuit has enough extra resources that can be used to redistribute the functionality performed by a failed fan-in cone.

A programmable circuit such as a PLD can be programmed so that the user design and unused resources are distributed throughout the layout area of the programmable circuit. Resources programmed according to a user design are not clustered in the same area of the chip. This ensures that there are unused resources near the failed logic elements in the layout.

Failed logic elements can be replaced by unused logic elements that are near the failed logic elements in the topographical layout. This technique reduces the interconnect resources needed to connect the unused logic elements to the rest of the user design.

If the user design is too densely packed in one portion of the circuit layout, there may be not enough unused resources near the failed logic elements to replace them. In this case, the failed logic elements have to be replaced with unused logic elements that are far away in the layout. This can disrupt operable circuit elements in the user design.

For example, there may not be enough interconnect resources available to connect new logic elements that are too far away from the failed logic elements. By distributing unused resources throughout a user design, failed portions of the user design can be replaced with unused circuit elements, while minimizing the impact on the rest of the user design.

Thus, the original user design can be programmed into the PLD so that spare resources are distributed evenly in the layout of the user design. This eases the process of reconfiguring the user design to eliminate defects.

In one example, the PLD can be first partitioned of into multiple blocks. In each block, the maximum logic and routing resources used can be limited to a maximum percentage. So when the user design is reconfigured to eliminate defects, each block contains some spare resources to handle the reconfiguration. The reconfiguration process can then be handled locally within a small number of blocks and does not effect the user design globally.

If the fan-in cone identified by the analysis engine is large, it may be desirable to further isolate the defect. By isolating a defect, less resources have to be disabled to eliminate errors caused by the defect.

Before a fan-in cone effected by a defect is replaced, diagnostic tests can be performed to reduce the size of the effected fan-in cone. To reduce the size of the effected fan-in cone, all of the outputs of the logic elements in the fan-in cone are registered. Additional diagnostic testing is then performed to further isolate the defect as will be discussed in further detail below.

Referring to the example shown in FIG. 2, a defect is located between logic elements LE2 and LE6. A diagnostic test determines that an erroneous value appears at the observation point of LE1. The analysis engine then traces the fan-in cone LE1–LE9 shown in FIG. 2 and all of the interconnections in between logic elements LE1–LE9. The fan-in cone shown in FIG. 2 is merely one example of the present invention. The principles of the present invention may be used to trace out a fan-in cone that represents any number of circuit elements and any type of interconnections.

The fan-in cone LE1–LE9 is relatively large. It is undesirable to a have large fan-in cone that is adversely effected by a defect, because a large number of circuit elements have to be replaced to correct the errors caused by the defect. A large fan-in cone may require a substantial reconfiguration of the user design. The fan-in cone shown in FIG. 2 can be reduced using techniques of the present invention.

In the fan-in cone shown in FIG. 2, logic elements LE1, LE3, LE4, LE5, LE7, LE8, and LE9 have registered outputs, and logic elements LE2 and LE6 do not have registered outputs in the user design. This means that the output registers in logic elements LE2 and LE6 are not enabled.

Microprocessor 101 scans test data through the registers in logic elements LE1, LE3, LE4, LE5, LE7, LE8, and LE9. When an erroneous value appears at the output register of LE1, microprocessor 101 cannot determine where in the fan-in cone the defect lies, because the outputs of LE2 and LE6 are not registered.

Typically, each of the logic elements in a PLD includes a register. Microprocessor 101 enables an output register in each of the logic elements in the fan-in cone. These registers are used to form a scan chain for storing and reading out test values.

To reduce the size of the fan-in cone shown in FIG. 2, microprocessor 101 activates the registers at the outputs of LE2 and LE6 so that the output signals of LE2 and LE6 are latched. Once the LE2 and LE6 output registers are enabled, microprocessor 101 forms a scan chain that includes at least one register in each of logic elements LE1–LE9.

Another diagnostic test is then performed. A test value is scanned into a register in each logic element LE1–LE9 in the fan-in cone. Each of the test values is then transferred into an adjacent register that is one position higher in the fan-in cone. These transfers can occur in a single clock cycle.

For example, the test values stored in the LE7 and LE9 registers are transferred to LE6. LE6 performs a logic function on these two test values and then stores the result in the LE6 register.

In the presently described embodiment, only one clock cycle occurs during the diagnostic test. However, a suitable diagnostic test used in accordance with the present invention may use any number of clock cycles.

After one clock cycle, the test values are then read out of the scan registers. The test values are stored into and read out of the logic element scan registers along signal paths that are not shown in FIG. 2.

Microprocessor 101 can use the test results to further isolate the location of the defect in the fan-in cone. Because the test values are read out of the registers after one clock cycle, the test values initially stored in logic elements LE2–LE5 are passed to LE 1. The register in LE1 captures a correct value. Therefore, the connections between LE2–LE5 and LE1 are ruled out as possible sources of the defect.

The test values stored in LE7 and LE9 pass to LE6. The register in LE6 also captures a correct value. Therefore, the connections between LE7, LE9, and LE6 are ruled out as possible sources of the defect.

The register in LE2 captures the erroneous value caused by the defect shown in FIG. 2. Because only one clock cycle occurs during the diagnostic test, the defect must exist in LE6, LE8, LE2, or the connections in between these logic elements.

Figure 4:
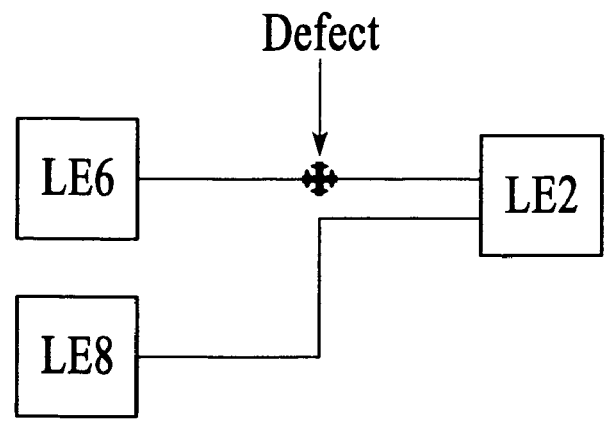
FIG. 4 illustrates an example of a reduced fan-in cone produced by registering the outputs of two of the logic elements in accordance with the present invention.

With this information, the fan-in cone that is effected by the defect can be reduced to three logic elements (LE2, LE6, and LE8) as shown in FIG. 4. Only the fan-in cone shown in FIG. 4 needs to be replaced to eliminate failures caused by the defect between LE2 and LE6.

The above described embodiments reduce the amount of circuit elements that need to be replaced to eliminate failures caused by a defect. However, even after the effected fan-in cone has been reduced using these techniques, it may be desirable to further reduce the size of the fan-in cone to save additional resources.

Figure 5:
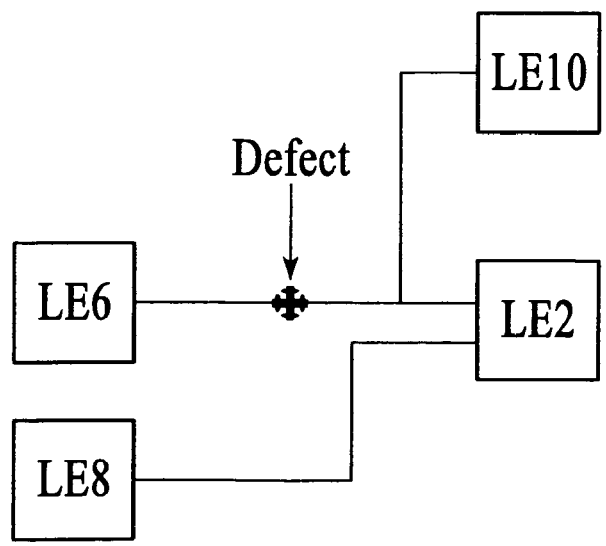
FIG. 5 illustrates an example of a multiple fan-out cone associated with a defect in a programmable logic device in accordance with the present invention.

If the assumption is made that only a single defect exists in a fan-in cone, the fan-in cone can be reduced further by taking advantage of the fan-out resources. For example, one terminal of LE2 may be coupled to logic element LE10 as shown in FIG. 5. If LE10 also captures an erroneous value, then the common portions of the fan-in cone of LE2 and LE10 are marked as suspect and replaced. This technique eliminates LE8 as a potential suspect for the location of the defect. Therefore, only LE2, LE6, and LE10 (and their interconnect resources) need to be replaced. LE8 does not need to be replaced.

The fan-out cone shown in FIG. 5 is merely one example of a fan-out cone that can be utilized to narrow down the suspect resources. The principles of the present invention can also be used to narrow down suspect resources by using other types of fan-out cones.

According to another embodiment of the present invention, the number of suspect resources associated with a defect can also be reduced using the following techniques. Specialized diagnostic tests can be performed to identify "stuck-at" type defects. Stuck-at type defects are defects that cause an output signal to get stuck at a HIGH value (i.e., 1) or at a LOW value (i.e., 0). A logic element that outputs an erroneous value is configured as an AND gate and then as an OR gate to identify the source of the stuck-at type defect.

For example, logic element LE2 is first configured as an AND gate according to a first diagnostic test. A first test vector is then applied to the resources coupled to LE2. When the first test vector is applied, the register in LE6 is scanned with a 0, and the register in LE8 is scanned with a 1. These test values are stored in the LE6 and LE8 output registers. After one clock cycle, the output of LE2 is tested. If the output of LE2 is 1, then resources associated with LE6 have a stuck-at 1 defect.

The resources associated with LE6 include logic element LE6 and the interconnect structure coupling LE6 to LE2. In the example of FIG. 4, the defect exists on the interconnect between LE2 and LE6. The stuck-at type diagnostic tests cannot determine if the defect exists inside LE6 or on the interconnect between LE2 and LE6.

A second test vector is then applied to the resources coupled to LE2. When the second test vector is applied, the register in LE6 is scanned with a 1, and the register in LE8 is scanned with a 0. These test values are stored in the LE6 and LE8 output registers. If the output of LE2 is 1 after one clock cycle, then the resources associated with LE8 have a stuck at 1 defect.

Logic element LE2 is then configured as an OR gate according to a second diagnostic test. A first vector is again applied to resources coupled to LE2. The register in LE6 is scanned with a 0, and the register in LE8 is scanned with a 1. If the output of LE2 is 0 after one clock cycle, then the resources associated with LE8 have a stuck-at 0 type defect.

The second vector is then applied again to the resources coupled to LE2. The output register of LE6 is scanned with a 1, and the output register of LE8 is scanned with a 0. If the output of LE2 is 0 after one clock cycle, then the resources associated with LE6 have a stuck-at 0 type defect.

By performing the stuck-at 1 and stuck-at 0 tests, the exact LE associated with the defect can be isolated. The techniques of this embodiment of the present invention greatly reduce the amount of resources that have to be disabled and replaced to eliminate errors caused by a defect in a programmable integrated circuit. These techniques reduce the reconfiguration requirements needed to replace a failed group of circuit elements, thereby minimizing adverse impacts on the user design.

If the route between LE2 and LE6 included a number of interconnect segments, the defect can be isolated further by providing observation points at the intermediate segments. Stuck-at tests or other diagnostic tests can be performed from the intermediate segment points to further pin-point the location of the defect.

The stuck-at type defects described above are merely one example of diagnostic tests that can be performed to reduce the suspect circuit elements and interconnections effected by a defect. Other similar diagnostic tests may also be performed to isolate a defect in a programmable circuit according to the principles of the present invention.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A method for repairing failures on a programmable circuit, the method comprising:
   configuring the programmable circuit according to a user design;
   identifying an error in a first row of circuit elements on the programmable circuit;
   disabling the first row of circuit elements;
   replacing the first row of circuit elements with a first unused redundant row of circuit elements by configuring the first redundant row according to the user design;
   verifying the first redundant row is configured according to the user design, wherein if the first redundant row configuration does not match the user design, then disabling the first redundant row and replacing the first redundant row with at least one other redundant row and configuring the at least one other redundant row according to the user design;
   verifying the at least one other redundant row is configured according to the user design; and
   determining if a cause of the error is located in the first row of circuit elements or located in another row of circuit elements associated with the first row of circuit elements.

2. The method of claim 1 wherein a microprocessor disables the first row of circuit elements and replaces the first row of circuit elements with the first unused redundant row of circuit elements.

3. The method of claim 2 wherein the microprocessor and the programmable circuit reside on one integrated circuit.

4. The method of claim 1 wherein the programmable circuit comprises rows of logic elements including the first row of circuit elements and the first unused row of redundant circuit elements.

5. The method of claim 1 wherein the programmable circuit comprises a fuse register that provides access to the first row of circuit elements and the first unused redundant row of circuit elements.

6. The method of claim 1 further comprising:
   identifying an error in a second row of circuit elements on the programmable circuit;
   re-enabling the first row of circuit elements to operate according to the user design;
   disabling the second row of circuit elements; and
   replacing the second row of circuit elements with the first unused redundant row of circuit elements by configuring the first redundant row according to the user design.

7. The method of claim 1 further comprising:
   identifying an error in a second row of circuit elements on the programmable circuit; and
   replacing the second row of circuit elements with a second unused redundant row of circuit elements by configuring the second redundant row according to the user design.

8. A computer system for repairing a failure on a programmable circuit, that is programmed according to a user design, the computer system comprising:
   code for identifying, during operation of the user design, an error at an observation point on the programmable circuit using a microprocessor;
   code for identifying a fan-in cone of circuit elements in the user design, the fan-in cone including a defect that is causing the error at the observation point;
   code for replacing the circuit elements in the fan-in cone with unused circuit elements in the programmable circuit by configuring the unused circuit elements according to the user design;
   code to determine which of the circuit elements of the fan-in cone are associated with the defect by interchanging one or more of the circuit elements in the fan-in cone with the unused circuit elements; and
   code to isolate the defect by disabling the circuit elements associated with the defect.

9. The computer system of claim 8 wherein the circuit elements in the fan-in cone comprises logic elements coupled together.

10. The computer system of claim 8 wherein the code for identifying the fan-in cone of circuit elements in the user design further comprises:
    code for enabling registers in each of the circuit elements in the fan-in cone;
    code for performing an operability test by scanning test values into the registers in the circuit elements of the fan-in cone; and code for eliminating a subset of the circuit elements from the fan-in cone based on values read from the registers during the operability test.

11. The computer system of claim 8 wherein the programmable circuit and the microprocessor reside on one integrated circuit.

12. The computer system of claim 8 further comprising:
code for identifying a fan-out cone of circuit elements in the user design;
code for performing an operability test on the circuit elements in the fan-out cone by scanning test values into registers in the fan-out cone; and
code for eliminating a subset of the circuit elements from the fan-in cone based on values read from the registers in the fan-out cone during the operability test.

13. The computer system of claim 8 further comprising:
code for performing a stuck-at 1 test on at least one of the circuit elements in the fan-in cone to further isolate the defect before the fan-in cone is disabled; and
code for performing a stuck-at 0 test on at least one of the circuit elements in the fan-in cone to further isolate the defect.

14. The computer system of claim 13 further comprising:
code for eliminating at least one circuit element from the fan-in cone based on the stuck-at 1 and the stuck-at 0 tests.

15. The computer system of claim 8 wherein the code for replacing the circuit elements in the fan-in cone further comprises:
code for disabling the circuit elements in the fan-in cone.

16. A method for routing around a defect on programmable circuit, the method comprising:
configuring the programmable circuit according to a user design;
identifying an error caused by the defect;
isolating a first set of circuits on the programmable circuit to contain the defect, wherein the first set of circuits are coupled together in the user design; and
replacing the first set of circuits with a second set of unused circuits in the programmable circuit by configuring the second unused circuits according to the user design;
verifying the second set of unused circuits is configured according to the user design, if the second set of unused circuit's configuration does not match the user design, then disabling the second set of unused circuits and replacing the second set of unused circuits with another set of unused circuits and configuring the other set of unused circuits according to the user design; and
determining if a cause of the defect is located in the first set of circuits or is located in another set of circuits associated with the first set of circuits.

17. The method of claim 16 wherein a processor replaces the first set of circuits with the second set of unused circuits, and wherein the programmable circuit and the processor reside on one integrated circuit.

18. The method of claim 16 wherein isolating the first set of circuits further comprises:
performing an operability test on the first set of circuits by scanning test values into registers in each of the first set of circuits; and
further isolating the defect by eliminating circuits from the first set of circuits based on values read from the registers during the operability test.

19. The method of claim 18 wherein:
performing the operability test on the first set of circuits further comprises identifying a third circuit in the first set of circuits that produces an erroneous value; and
further isolating the defect further comprises reducing the first set of circuits to the third circuit and a fourth set of circuits that provides signals directly to the third circuit.

20. The method of claim 19 wherein:
the fourth set of circuits comprises fifth and sixth circuits that provide signals to the third circuit; and
reducing the first set of circuits further comprises eliminating the sixth circuit from the fourth set of circuits by detecting an erroneous value stored in a seventh circuit that is coupled to the fifth circuit and the third circuit.

21. The method of claim 16 further comprising:
performing a stuck-at 1 test on at least one of the first set of circuits to further isolate the defect; and
performing a stuck-at 0 test on at least one of the first set of circuits to further isolate the defect.

22. A failure repair system comprising:
a programmable circuit comprising logic elements configured according to a user design, wherein the programmable circuit contains a defect;
an analysis engine that identifies a first set of logic elements in the programmable circuit associated with the defect, wherein the first set of logic elements are coupled together in the user design;
a microprocessor that replaces the first set of logic elements with a second set of logic elements in the programmable circuit, and configures the second set of logic elements according to the user design, wherein the microprocessor further isolates the defect by verifying the second set of logic elements matches the user design, and if the second set of logic elements does not match the user design, then the microprocessor further isolates the defect by replacing the second set of logic elements with another set of logic elements, wherein after a replacement set of logic elements matches the user design, the analysis engine is configured to determine if a cause of the defect is located in the first set of logic elements or is located in another set of logic elements associated with the first set of logic elements.

23. The failure repair system of claim 22 wherein the microprocessor and the programmable circuit reside on one integrated circuit.

24. The failure repair system of claim 22 wherein:
the microprocessor performs an operability test on the first set of logic elements by storing test values in registers associated with each of the logic elements, and
the analysis engine further isolates the defect in response to results of the operability test by reducing the first set of logic elements to a third logic element and a fourth set of logic elements that provide signals directly to the third logic element.

25. The failure repair system of claim 24 wherein:
the fourth set of logic elements comprise fifth and sixth logic elements that provide signals to the third logic element; and
the microprocessor eliminates the sixth logic element from the fourth set of logic elements by testing a value stored in a seventh logic element that is coupled to the fifth and the third logic elements.

26. The failure repair system of claim 22 wherein:
the microprocessor performs a stuck-at 1 test on at least one of the first set of logic elements to further isolate the defect; and
the microprocessor performs a stuck-at 0 test on at least one of the first set of logic elements to further isolate the defect.

* * * * *